United States Patent
Asauchi

(10) Patent No.: US 7,591,524 B2
(45) Date of Patent: Sep. 22, 2009

(54) SEMICONDUCTOR MEMORY DEVICE

(75) Inventor: Noboru Asauchi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 573 days.

(21) Appl. No.: 11/458,820

(22) Filed: Jul. 20, 2006

(65) Prior Publication Data

US 2007/0019497 A1   Jan. 25, 2007

(51) Int. Cl.
*B41J 29/393*     (2006.01)
*G11C 8/00*      (2006.01)

(52) U.S. Cl. .................................... 347/19; 365/233.19

(58) Field of Classification Search ............ 347/5, 347/19, 86; 365/189.04, 189.07, 230.09, 365/233.1, 233.19, 239; 711/203, 206
See application file for complete search history.

(56) References Cited

U.S. PATENT DOCUMENTS

| 5,049,898 | A | * | 9/1991 | Arthur et al. ................ | 347/19 |
| 5,506,611 | A | * | 4/1996 | Ujita et al. .................. | 347/86 |
| 6,494,559 | B1 | | 12/2002 | Tsuji | |
| 6,923,531 | B2 | * | 8/2005 | Saruta ........................ | 347/86 |

FOREIGN PATENT DOCUMENTS

| JP | 07-219856 A | 8/1995 |
| JP | 09-160969 A | 6/1997 |
| JP | 2752402 B2 | 2/1998 |
| JP | 3270831 B2 | 1/2002 |
| JP | 2002-067290 A | 3/2002 |
| JP | 2002-334592 A | 11/2002 |
| WO | 2001/25017 A1 | 4/2001 |

OTHER PUBLICATIONS

English translation of International Search Report from Int'l appln No. PCT/JP2006/314927 (Oct. 31, 2006).
English translation of International Preliminary Report on Patentability from Int'l appln No. PCT/JP2006/314927 (Feb. 7, 2008).

* cited by examiner

*Primary Examiner*—Anh T. N. Vo
(74) *Attorney, Agent, or Firm*—Stroock & Stroock & Lavan LLP

(57) ABSTRACT

In a semiconductor memory device 10, the maximum counter value in a carry-up unit 111 of an address counter 110 is set to 128 bits when an access request is for writing data to a memory array 100. On the other hand, in the semiconductor memory device 10, if the access request is for reading data from the memory array 100, the maximum counter value in the carry-up unit 111 of the address counter 110 is set to 256 bits. The result is that it is possible to reduce the circuit structure required for specifying the desired address in an EEPROM array 101 and a masked ROM array 102.

10 Claims, 7 Drawing Sheets

Fig.2

|    | A0  | A1 | A2 | A3  | A4 | A5 | A6 | A7  |
|----|-----|----|----|-----|----|----|----|-----|
| 1  | 00H | ID |    |     |    |    |    | 07H |
| 2  | 08H |    |    | WRA |    |    |    | 0FH |
| 3  | 10H |    |    |     |    |    |    | 17H |
| 4  | 18H |    |    |     |    |    |    |     |
| 5  |     |    |    |     |    |    |    |     |
| 6  |     |    |    |     |    |    |    |     |
| 7  |     |    |    |     |    |    |    |     |
| 8  |     |    |    |     |    |    |    |     |
| 9  |     |    |    | WPA |    |    |    |     |
| 10 |     |    |    |     |    |    |    |     |
| 11 |     |    |    |     |    |    |    |     |
| 12 |     |    |    |     |    |    |    |     |
| 13 |     |    |    |     |    |    |    |     |
| 14 |     |    |    |     |    |    |    |     |
| 15 |     |    |    |     |    |    |    |     |
| 16 |     |    |    |     |    |    |    | 7FH |

101

|    | A0  | A1 | A2 | A3 | A4 | A5 | A6 | A7  |
|----|-----|----|----|----|----|----|----|-----|
| 17 | 80H |    |    |    |    |    |    |     |
| 18 |     |    |    |    |    |    |    |     |
| 19 |     |    |    |    |    |    |    |     |
| 20 |     |    |    |    |    |    |    |     |
| 21 |     |    |    |    |    |    |    |     |
| 22 |     |    |    |    |    |    |    |     |
| 23 |     |    |    |    |    |    |    |     |
| 24 |     |    |    |    |    |    |    | BFH |

102

100

SEMICONDUCTOR MEMORY DEVICE

FIELD OF TECHNOLOGY

The present invention relates to semiconductor memory devices accessed sequentially, and to address control methods in semiconductor memory devices that are accessed sequentially.

BACKGROUND ART

EEPROMs are known as semiconductor memory devices wherein the data cells in the memory array can only be accessed sequentially. Because this type of semiconductor memory device is relatively inexpensive, it is used as a memory device for storing data pertaining to the quantity of remaining consumable materials or the quantity of consumable materials used. Moreover, there are also semiconductor memory devices that have been produced that have multiple data storage areas, for example, EEPROM areas and masked ROM areas. In semiconductor memory devices that have multiple data storage areas, the use of masked ROM area has the benefit of eliminating the need for writing read-only data to the semiconductor memory device.

However, sequential access semiconductor devices, when provided with a single data storage area that has an area that can be written that is smaller than the read-only area cannot return to the starting address of the writeable area without counting up until the final address of the read-only area first. The result is a problem in that more time is required in the data writing process than in reading out data.

Moreover, because in a semiconductor memory device the address at which access is started is typically specified using an address code, and semiconductor memory devices that are provided with a plurality of data storage areas, address codes must be provided for each of the data storage areas, which tend to increase the scope of the circuit structure.

SUMMARY OF THE INVENTION

The present invention is to address the issues described above, and the object thereof is to achieve a reduction in the time required for writing data in a semiconductor memory device, and to achieve a reduction in the circuit structure required for specifying addresses.

A first aspect of the present invention in order to address the issues described above provides a semiconductor memory device. The semiconductor memory device according to the first aspect of the present invention comprises an address counter that counts counter values to specify a target address to be accessed, wherein the maximum counter values are different at the time of reading data from at the time of writing data, a non-volatile memory array that is accessed sequentially until the target address specified by the address counter is reached, data writing module that writes data, by a specific address unit, from said target address of said memory array, and data reading module for reads out data from a target address of said memory array.

Given the semiconductor memory device according to the first aspect of the present invention, an address counter having different maximum counter values at the time of reading data than at the time of writing data is used to specify the target address that is to be accessed, thus making it possible to both achieve a reduction in the data read time, and to achieve a reduction in the circuit structure required for specifying the address.

In the semiconductor memory device as set forth in the first aspect of the present invention, the address counter may specify the starting address of the memory array after counting the counter values up until each of the maximum counter values. In this case, it is possible to return to the starting address of the memory array after the counter value has reached the maximum counter value.

In the semiconductor memory device according to the first aspect of the present invention, the address counter may count external clock signals, synchronized with said external clock signals that are inputted from the outside of the semiconductor memory device.

In the semiconductor memory device according to the first aspect of the present invention, the memory array is provided with a first memory area having a first ending address, and a second memory area, having a second ending address, and following the first memory area, where the maximum counter value at the time of writing is a counter value corresponding to the first ending address, and the maximum counter value at the time of reading may be a value wherein a specific value is added to the counter value corresponding to the second ending address. In this case, because the address specification process is not performed for the second storage area when writing data, it is possible to reduce the time required for writing data to the first storage area.

In the semiconductor memory device according to the first aspect of the present invention, the address counter may specify the starting address of the first storage area in the memory array after counting until each of the maximum counter values. In this case, the counter value may return to the starting address of the first storage area after arriving at the maximum counter value.

In the semiconductor memory device according to the first aspect of the present invention, the first storage area is a storage area to which data is writable, and the second storage area is a storage area from which data is only readable. In this case, when writing data not only is the address specification process performed only for the first storage area, but also, when reading data, the address specification process is performed for both the first and second storage areas.

In the semiconductor memory device according to the first aspect of the present invention, the first storage area may be a 128-bit storage area wherein data may be stored, the second storage area may be a 64-bit storage area wherein data may be stored, and the address counter may be an 8-bit address counter, wherein, when writing, the starting address for the first storage area may be specified after the value of the MSB bit takes a "1," and when reading, the starting address of the first storage area may be specified after the values of all eight bits take "1." In this case, after the counter value has reached 256 when reading data, or after the counter value has reached 128 bits when writing data, the address counter may return to the starting address of the first storage area.

A second aspect of the present invention provides an address control method in a semiconductor memory device provided with a non-volatile memory array that is accessed sequentially, until a target address that is specified by an address counter that counts, synchronized with an external clock, is reached. The address control method according to the second aspect of the present invention comprises determining whether an access request to the memory array is a write request or a read request, and if the access request is a write request, specifying the starting address in the memory array when the external clock has been counted until the first maximum counter value, and if the access request is a read request, specifying the starting address of the memory array when the external clock has been counted until the second maximum counter value, which is larger than the first maximum counter value.

Not only can the address control method according to the second form of the present invention provide the same operating effects as in the semiconductor memory device according to the first form of the present invention, but also the address control method according to the second form of the present invention can be embodied in a variety of forms, in the same manner as the semiconductor memory device according to the first form of the present invention.

The method according to the second form of the present invention can also be embodied as a computer program or a computer-readable memory medium on which a computer program is recorded.

BRIEF DESCRIPTION OF THE DRAWINGS

The present invention will be readily understood by the following detailed description in conjunction with the accompanying drawings. To facilitate this description, like reference numerals designate like structural elements.

FIG. 2 shows an explanatory diagram illustrating schematically an internal structural map of a memory array provided in a semiconductor memory device according to the present embodiment.

DESCRIPTION OF THE PREFERRED EMBODIMENTS

The semiconductor memory device according to the present invention, and the address control method in the semiconductor memory device, will be explained below based on example of embodiment, while referencing the figures.

Structure of the Semiconductor Memory Device

Figure 1:
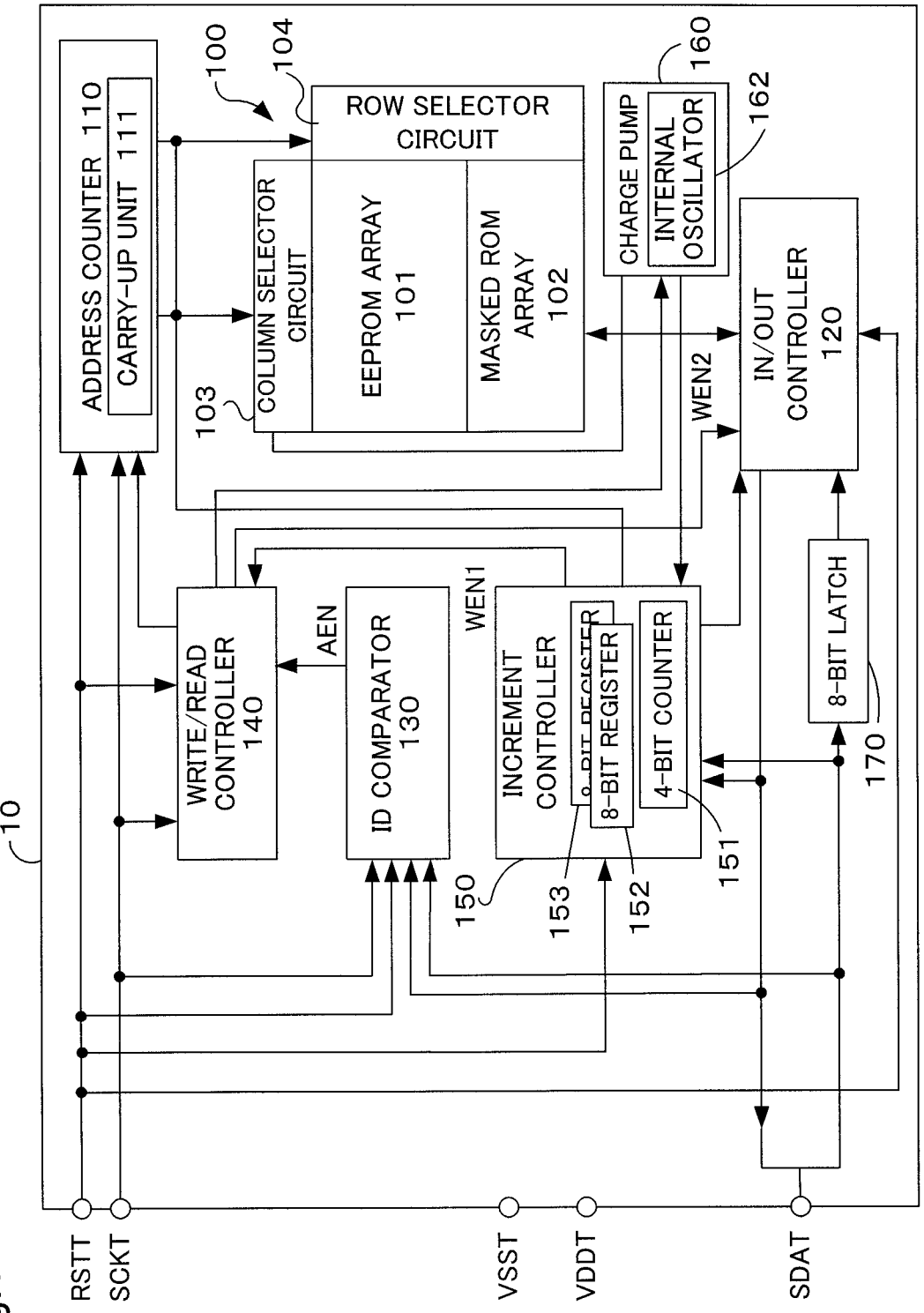
FIG. 1 shows a block diagram illustrating the functional internal structure of a semiconductor memory device according to the present embodiment.

The structure of the semiconductor memory device 4 according to the present example of embodiment will be described in reference to FIG. 1 and FIG. 2. FIG. 1 is a block diagram illustrating the functional internal structure of a semiconductor memory device according to the present example of embodiment. FIG. 2 is an explanatory diagram illustrating schematically an internal structural map of a memory array provided in the semiconductor memory device according to the present example of embodiment.

In the present example of embodiment, a semiconductor memory device 10 is a sequential access-type memory device that does not require the inputting of address data from the outside to specify the address for starting the access. The semiconductor memory device 10 comprises a memory array 100, an address counter 110, an in/out controller 120, an ID comparator 130, a write/read controller 140, an increment controller 150, a charge pump circuit 160, and an 8-bit latch register 170. Each of these circuits is connected through bus-type signal lines.

The memory array 100 comprises an EEPROM array 101 and a masked ROM array 102. The EEPROM array 101 is a memory area that has the features of an EEPROM wherein data can be erased and written electrically. The masked ROM array 102 is a memory area that has the features of a masked ROM wherein the data that is written in the manufacturing process cannot be erased or overwritten.

The EEPROM array 101 and the masked ROM array 102 of the memory array 100 are provided with a plurality of data cells (memory cells) for storing 1-bit data, as shown schematically in FIG. 2. In the present example of embodiment, the memory array 100, as shown in FIG. 2, is provided with eight addresses (addresses for 8 bits worth of data) in one row as the specific address units, where, for example, 8 data cells (8 bits) are arrayed in one row, and 16 data cells (16 words) are arranged in one column, and so can store 16 words×8 bits (128 bits) of data. The masked ROM array 102 has 8 data cells (8 bits) in one row, with 8 data cells (8 words) in one column, and so is able to store 8 words×8 bits (64 bits) of data.

The address map of the memory array 100 will be explained referencing FIG. 2. The memory array 100 in the present example of embodiment is provided with an EEPROM array 101 and a masked ROM array 102, as described above. The identification information (ID information) for identifying each of the semiconductor memory devices is stored in the first three addresses (first row, columns A0 through A2: 3 bits) in the EEPROM array 101. Writing is prohibited to the first row that includes the first three addresses, and so, for example, this row cannot be over written after shipping from the factor.

In the example in FIG. 2, the ninth address (08H) through the 16th address (0FH) and the 17th address (10H) through the 24th address (07H) of the EEPROM array 101 can store 16-bits of data that can be overwritten under specific conditions. Note that in the present example of embodiment, the rows comprising the ninth address through 16th address and 17th address through 24th address are known an the write-control rows, and the 8 addresses in the 9th address through the 16th address and the 8 addresses in the 17th address through 24th address are known as write control storage addresses for specific address units. Moreover, these specific conditions are the case wherein, for example, the stored information is information pertaining to the amount of ink that has been consumed, and the value of the data to be written is larger than the value of the existing data, or the case wherein the stored information is information regarding the amount of ink remaining, and the value of the data to be written is less than the value of the existing data.

Address 25 and beyond in the EEPROM array 101 is a read-only area wherein writing is prohibited, and cannot, for example, be overwritten after shipment from the factory. Note that each of these address properties (this address map) are merely examples, and the various address properties may be determined so that, in addition to the write-controlled area, there is also a write-enabled area for which the writing is not controlled.

In the masked ROM array 102, the information (data) is written when the memory array is manufactured, and after the memory array manufacturing writing cannot be performed to this area, even prior to factory shipment. Note that the masked ROM array 102 is a 64-bit data storage area, where the maximum address of the masked ROM array 102 that can be specified logically is 192 (BFH), but the memory array 100 is provided with a circuit structure that outputs dummy data (for example "0") until the 256th address (FFH) even if the maximum value for the masked ROM array 102 is exceeded. The result is that the memory array 100 is a memory array that can be used easily, provided with a 128-word×128-bit virtual memory area.

The memory array 100 in the present example of embodiment is provided with a plurality of rows, which are 8-bit units, as described above, where the data cell columns are not independent for each row, but rather are produced in what is termed as one data cell column folding back in 8-bit units. That is, for convenience, the row that includes the 9th bit is known as the second byte, and the row that contains the 17th bit is known as the third byte, the result is that in order to access the desired address in the memory array 100, it is necessary to access sequentially from the beginning, that is, necessary to access using the so-called sequential access method," where directly accessing the desired address, which is possible in the case of a random access method, is not possible in the sequential access method.

A word line and a bit (data) line are connected to each of the data cells in the memory array 100, where data is written to a data cell by selecting (applying a selection voltage to) the corresponding word line (row) and applying a write voltage to the corresponding bit line. The data (a "1" or a "0") of the data cell is read out by selecting the corresponding word line (row) and connecting the corresponding bit line to the IN/OUT controller 120, and then detecting whether or not there is a current. Note that in the present example of embodiment the specific address unit can be thought of as the number of addresses (number of data cells) that can be written by applying a write voltage to a single word line.

The column select circuit 103 sequentially selects the columns (bit lines) to the IN/OUT controller 120 in accordance with the external clock pulses that are counted by the address counter 110. For example, the column select circuit 103 connects the bit lines in accordance with the values of the least significant four bits of the values of the eight bits that indicate the number of clock pulses counted by the address counter 110.

The row select circuit 104 applies a select circuit to the row (word line) sequentially according to the number of external clock pulses counted by the address counter 110. For example, the row select circuit 104 selects word lines according to the value of the most significant four bits of the values of the eight bits that indicate the number of clock pulses counted by the address counter 110. As described above, the semiconductor memory device 10 according to the present example of embodiment performs access to the desired address in accordance to the number of clock pulses that have been counted by the address counter 110 without performing access to the memory array 100 using address data.

The address counter 110 is connected to a reset signal terminal RSTT, a clock signal terminal SCKT, the column select circuit 103, the row select circuit 104, and a write/read controller 140. The address counter 110 is reset to the initial value by the reset signal, which is inputted through the reset signal terminal RSTT, going to "0" (or going low), and then counts the number of clock pulses, synchronized with the falling edge of the clock pulses, that are inputted through the external clock signal terminal SCKT after the reset signal has been set to "1."

The address counter 110 used in the present example of embodiment is an 8-bit address counter that stores the clock pulse counts corresponding to the number of data cells (number of bits) in one row in the memory array 100. Note that the initial value may be a value such that there is a relationship with the starting position of the memory array 100, and typically "0" is used as the initial value.

The address counter 110 is provided with a carry-up unit 111 for setting the maximum counter value for the number of clock pulses that should be counted. In the address counter 110, when the clock pulse count arrives at the maximum counter value, the address counter 110 returns the counter value to the initial value, which corresponds to the starting position in the memory array 100. In other words, the address specified by the address counter 110.

The address counter 110 used in the present example of embodiment uses a maximum counter value when data is being written to the memory array 100 that is different from that when data is being read from the memory array 100. Specifically, when the address counter 110 receives notification, from the write/read controller 140, to the extent that the requested access is for writing data, then the maximum counter value in the carry-up unit 111 is set to 128 bits. On the other hand, when the address counter 110 receives notification, from the write/read controller 140, that the requested access is for reading data, then the maximum counter value in the carry-up unit 111 is set to 256 bits.

In the present example of embodiment, a memory array 100 comprising an EEPROM array 101 and a masked ROM array 102, is used, as described above. The EEPROM array 101 is provided with 128 addresses, from the first address (00H) to the 128th address (7FH) where the masked ROM array 102 is provided with 64 addresses, from the 129th address (80H) through the 192nd address (BFH). Because it is not possible to write data to the masked ROM array 102, when data is being written the maximum counter value for the address counter 110, which is the maximum address for the memory array 100 that can be specified by the address counter 110, is set to the 128th address. The result is that it is possible to eliminate the address counts corresponding to the masked ROM array 102 wherein data cannot be written, making it possible to reduce the time required for writing data.

On the other hand, when data is being read, the maximum counter value for the address counter 110, that is, the maximum address in the memory array 100 that can be specified by the address counter 110, set to the 256th address. The result is that it is possible to access the addresses corresponding to the masked ROM array 102, making it possible to readout that data that is stored in the masked ROM array 102. Note that the masked ROM array 102 is a 64-bit data storage area, and although the maximum address of the masked ROM array 102 that can be specified logically is 192, as already stated above, after the maximum address of the masked ROM array 102 is exceeded, dummy data is outputted until the address 256 (FFH) is reached.

The IN/OUT controller 120 is a circuit that either sends the write data (which has been inputted into the data signal terminal SDAT) to the memory array 100, or receives data that is read out from the memory array 100 and outputs this data to the data signal terminal SDAT. The IN/OUT controller 120 is connected to the data signal terminal SDAT, the reset signal terminal RSTT, the memory array 100, and the write/read controller 140, and performs control so as to switch the direction of data transfer between being towards the memory array 100 or being towards the data signal terminal SDAT (that is, the signal lines that are connected to the data signal terminal SDAT) in accordance with the request from the write/read controller 140. An 8-bit latch register 170 that stores temporarily the write data that is inputted from the data signal terminal SDAT is connected to the input signal lines from the data signal terminal SDAT from the IN/OUT controller 120.

The 8-bit latch register 170 stores the data column (MSB) inputted through the input signal lines from the data signal terminal SDAT until 8-bits worth are stored, and when 8 bits worth are in place, the 8 bits of data that are held in the 8-bit latch register 170 are written to the EEPROM array 101. The 8-bit latch register 170 is a shift register of the so-called FIFO type (first in/first out type), and so when the 9th bit of input data is latched, the first bit of data that had already been latched is eliminated.

When the power supply is turned ON, or when there is a reset, the IN/OUT controller 120 sets the direction of data transfer relative to the memory array 110 to the readout direction, and prohibits the inputting of data into the data signal terminal SDAT by placing the input lines between the 8-bit latch register 170 and the IN/OUT controller 120 into a high-impedance state. This state is maintained until a write process request is inputted from the write/read controller 140. Consequently, the data for the first four bits of the data stream, inputted through the data signal terminal SDAT, is not written to the memory array 100 after a reset signal has been inputted, but rather the data that is stored in the first four bits of the memory array 100 (where the fourth bit thereof is "don't care") is sent to the ID comparator 130. The result is that the first four bits of the memory array end up in a read-only state.

The ID comparator 130 is connected to the clock signal terminal SCKT, the data signal terminal SDAT, and the reset signal terminal RSTT, and determines whether or not the identification data included in the input data stream that is inputted through the data signal terminal SDAT matches the identification data stored in the memory array 100 (the EEPROM array 101). More specifically, the ID comparator 130 receives the first three bits of data of the operation code that is inputted after the reset signal RST is inputted, or in other words, receives the identification data. The ID comparator 130 has a 3-bit register (not shown) for storing the identification data that is included in the input data stream, and a 3-bit register (not shown) for storing the identification data in the most significant three bits that are obtained from the memory array 100 through the IN/OUT controller 120, and determines whether or not the ID data matches by determining whether or not the values of both registers are identical. The ID comparator 130 sends an access enable signal EN to the write/read controller 140 is both ID data match. The ID comparator 130 clears the value in the register when the reset signal RST is inputted (that is, when RST="0" or is low).

The write/read controller 140 is connected to the IN/OUT controller 120, the ID comparator 130, the increment controller 150, the charge pump circuit 160, the clock signal terminal SCKT, the data signal terminal SDAT, and the reset signal terminal RSTT. The write/read controller 140 checks that the write/read control data (the data in the fourth bit following the 3-bit ID data), inputted through the data signal terminal SDAT, synchronized with the fourth clock signal after the input of the reset signal RST, and is a circuit that switches the internal operation of the semiconductor memory device 10 between either a writing operation or a reading operation. More specifically, when an access enable signal AEN is inputted from the ID comparator 130, or a write enable signal WEN1 is received from the increment controller WEN1, the write/read controller 140 decodes the write/read command that has been received. If the command is a write command, then the write/read controller 140 switches the data transfer direction of the bus signal lines for the IN/OUT controller 120 to the write direction, and sends a write enable signal WEN2, which enables writing, to the charge pump circuit 160, to request that the write voltage be generated.

In the present example of embodiment, if the write data DI that is written to a write-controlled row is data that has a characteristic that increases (increments) the value, a decision is made as to whether or not the write data DI is a value that is larger than the existing data DE that is already written to the write-controlled row, and if the write data DI is data that has a characteristic of decreasing (decrementing) the value, then a decision is made as to whether or not the write data DI has a value that is smaller than the existing data DE that is already stored in the write-controlled row, to thereby reduce or eliminate the corruption of data, or the inputting of incorrect data, by the write data DI. This function is provided by an increment controller in the former case, and by a decrement controller in the later case. In the present example of embodiment, the former case will be used as an example in the explanation below.

The increment controller 150 is connected through the signal lines to the charge pump circuit 160, the reset signal terminal RSTT, and the write/read controller 140. The increment controller 150 has an internal 4-bit counter 151 and 8-bit internal registers 152 and 153. The increment controller 150 determines whether or not the write data DI that is to be written to a write-controlled row is a value that is larger than the existing data DE that is already stored in the write-controlled row, to further determine whether the data to be written to the EEPROM array 101 has been written correctly (that is, performs a verify and validation process).

The increment controller 150 reads the existing data DE from the write-controller row of the EEPROM array 101 with the timing with which the write data DI is latched in the 8-bit latch register 170, and stores the existing data DE in the 8-bit internal register 152, which is provided within the increment controller 150. The increment controller 150 performs a bit-wise comparison of the existing data DE that has been read out and the write data DI that has been inputted into the 8-bit latch register 170 to determine whether or not the write data DI is data of a value that is larger than that of the existing data DE. Note that in order to accelerate processing and reduce the scope of the circuitry, the inputted write data is preferably the MSB.

When the write data DI is data of a value that is greater than that of the existing data DE, the increment controller 150 outputs a write enable signal WEN1 to the write/read controller 140. Note that when the write-controlled rows span multiple rows, then the increment controller 150 outputs the write enable signal WEN only when the write data DI is data of a value greater than that of the existing data DE in all of the write-controlled rows.

After the write data has been written, the increment controller 150 inspects whether or not the writing has been performed correctly, and if the write data is not written correctly, then the existing data DE, which is stored in the 8-bit internal register 152, provided within the increment controller 150, is written back to the memory array 100. When the write data is inspected, the 4-bit counter 151, which is provided in the increment controller 150, has an 8-bit delay, relative to the external clock signal, from the write standby state before beginning counting the internal clock signals from the internal oscillator 162 that is provided in the charge pump circuit 160. The counter value that is counted up by the 4-bit counter 151 is inputted into the column select circuit 103 and the row select circuit 104 to readout the existing data DE that has just been written.

The charge pump circuit 160, as described above, is a circuit for providing to the EEPROM array 101 the write voltage necessary for writing data through the column select circuit 103 to the selected bit lines based on the request signal from the write/read controller 140. The charge pump circuit 160 is provided with an internal oscillator that generates the operating frequency when stepping up the voltage, and produces the voltage required for writing by stepping up the voltage obtained through the positive power supply terminal VDDT.

Readout Process

Figure 3:
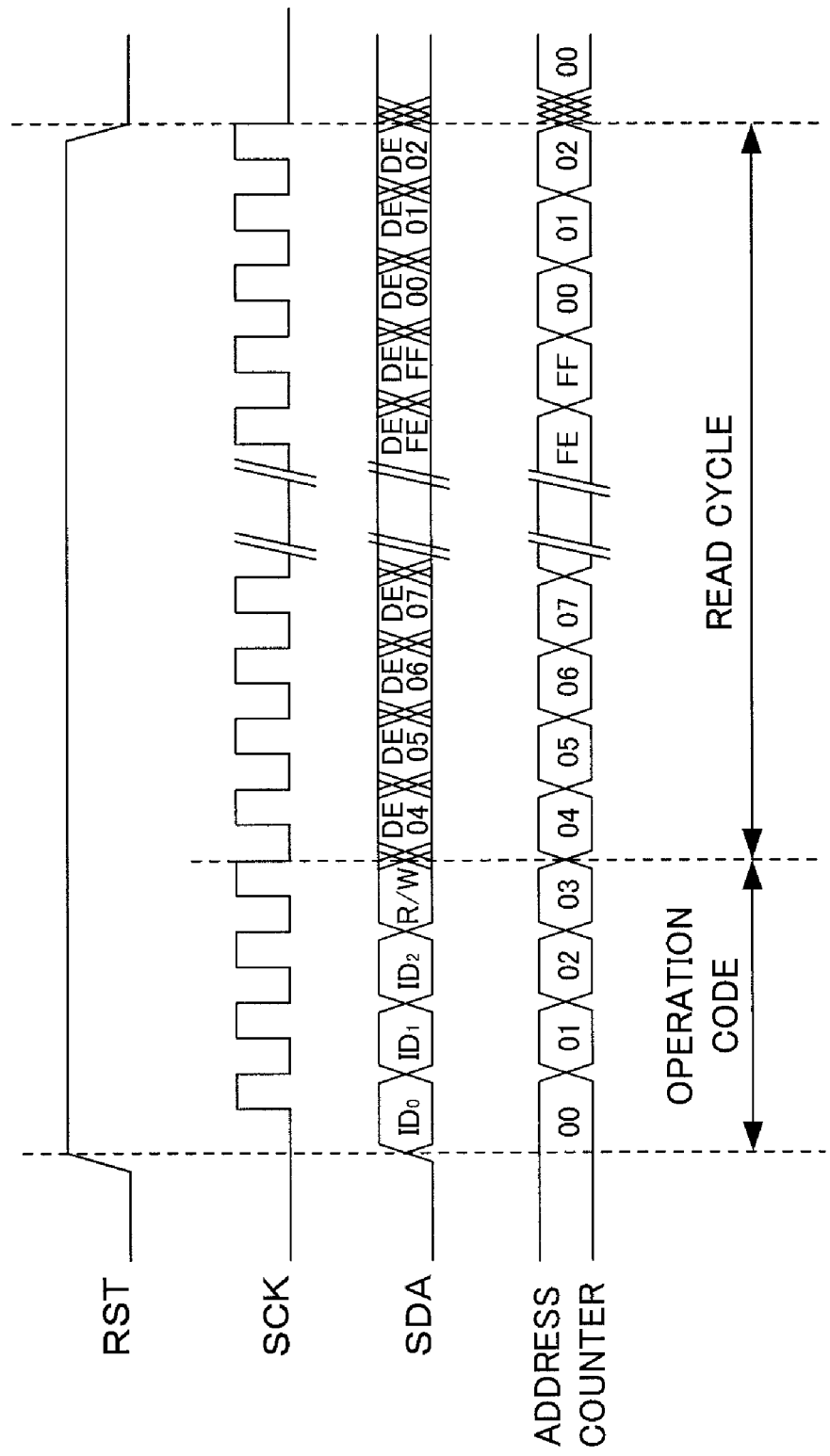
FIG. 3 is a timing flow chart illustrating the temporal relationships between the reset signal RST, the external clock signal SCK, the data signal SDA, and the address counter value during the execution of a read operation.
Figure 4:
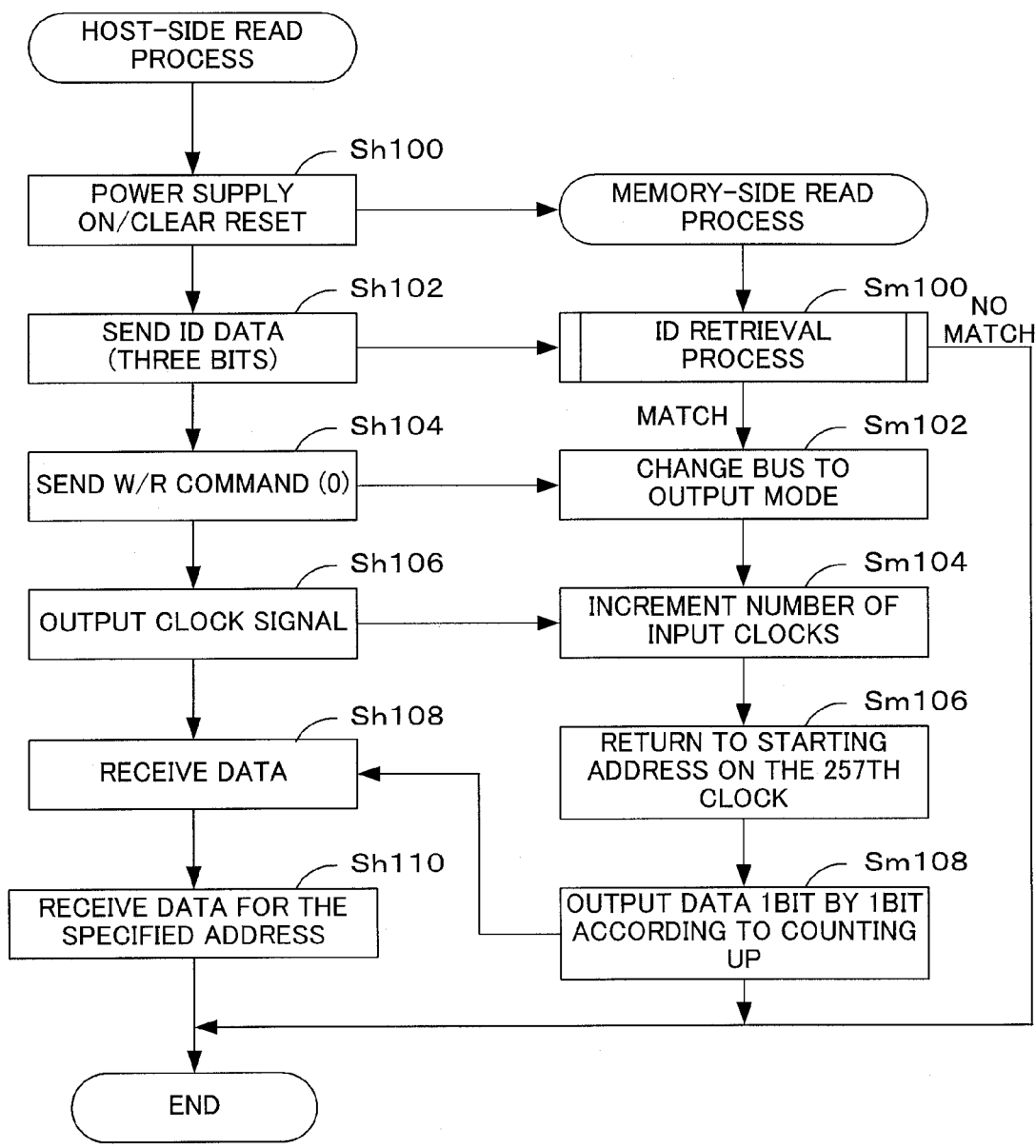
FIG. 4 is a flow chart illustrating the processing routine for a data read process that is executed by a host computer and a semiconductor memory device according to the present embodiment.

The readout operation in the semiconductor memory device 10 according to the present example of embodiment will be explained below referencing FIG. 3 and FIG. 4. FIG. 3 is a timing chart illustrating the temporal relationships between the values of the reset signal RST, the external clock signal SCK, the data signal SDA, and the address counter when the readout operation is performed. FIG. 4 is a flow chart illustrating the processing routine for the data readout process that is performed by the host computer and the semiconductor memory device 10 according to the present example of embodiment.

The procedures for checking the identification information and for checking the read/write commands, prior to the read operation, will be explained next. When the reset state (RST=0 or low) is released (RST=1 or high) (Step Sh100) by the host computer (in, for example, FIG. 8), the semiconductor memory device 10 begins the memory-side read process. The host computer inputs a data signal SDA, which includes a 4-bit operation code, into the data signal terminal SDAT of the semiconductor memory device 10, synchronized with the external clock signal. More specifically, the host computer first sends the 3-bit identification data to the semiconductor memory device 10 (Step Sf102). As is shown in FIG. 3, the memory array 100 stores, in the first three bits, identification data ID0, ID1, and ID2, and in the fourth bit from the beginning, stores a command bit that determines either writing or reading. The comparison of the identification data is performed as described below.

The ID comparator 130 of the semiconductor memory device 10 performs an ID retrieval process that determines whether or not the inputted identification data matches the identification data that is stored in the memory array 100 (Sm100). Specifically, the ID comparator 130 receives the data that is inputted into the data signal terminal SDAT on the rising edges of the three clock signal SCK after the reset signal RST has switched from low to high, or in other words, receives the three bits of identification data, and stores this data in a first 3-bit register. At the same time, the ID comparator receives the data from the addresses in the memory array 100 specified by the counter values 00, 01, and 02 of the address counter 110, or in other words, receives the identification data that is stored in the memory array 100, and stores this data in a second 3-bit register.

The ID comparator 130 determines whether or not the identification data stored in the first and second registers are identical, and if the identification data does not match (Step Sm100: No match), the input signal lines between the 8-bit latch register 170 and the IN/OUT controller 120 will be held in a high impedance state by the IN/OUT controller 120. The result is that access to the memory array 100 is not permitted, and the data read process is terminated. On the other hand, if the identification data in the first and second registers are identical (Step Sm100: match), the ID comparator 130 outputs an access enables signal AEN to the write/read controller 140.

The host computer inputs the command bit (the read command, for example, a "0" bit) into the data signal terminal SDAT synchronized with the rising edge of the fourth clock signal SCK after the reset signal RST switches from low to high (Step Sh104). The read/write controller 140, having received the access enable signal AEN, receives the command bit, which has been sent to the bus signal line through the data signal terminal SDAT, and determines whether or not the command is a write command. If the command bit that has been received is a write command, then the write/read controller 140 outputs a read command to the IN/OUT controller 120. The IN/OUT controller 120, having received a read command, changes the data transfer direction for the memory array 100 to the read direction (the output state) (Step Sm102), to enable data transfer from the memory array 100.

Moreover, the write/read command controller 140 provides notification to the address counter 110 that the requested access is a data read. Having received this notification, the count-up unit 111 of the address counter 110 sets the maximum counter value to 256 bits.

The host computer outputs, to the clock signal terminal SCKT of the semiconductor memory device 10, a number of clock signal SCK pulses corresponding to the address for which the access is desired, or in other words, corresponding to the address wherein the data to be read out is stored. (Step Sh106)

The address counter 110 of the semiconductor memory device 10 counts up the clock signals SCK, synchronized with the falling edges thereof, to count the number of inputted clock pulses (Sm104). Note that because the counter value of the address counter 110 after the operation code is inputted is "04," the existing data DE that is stored at 04H of the memory array 100 is read out. Although the memory array 100 of the semiconductor memory device 10 according to the present example of embodiment has addresses from 00H to BFH, the address counter 110, as already described above, counts up to the 256 bits (address FFH) that is set in the carry-up unit 111. Addresses C0H through FFH are a dummy region, where the corresponding addresses do not exist in the memory array 100, but rather when the dummy region is accessed, the value "0" is outputted to the data signal terminal SDAT. When the number of pulses corresponding to the address FFH, or in other words, 256, is counted up by the address counter 110, the address in the memory array 100 that is indicated by the address counter 110 returns to address 00H (Step Sm106). In other words, at the point wherein the values (bits) in the 8-bit register of the address counter 110 have all gone to "1," the starting address 00H of the EEPROM 101 in the memory array 100 is specified as the next access address.

The existing data DE that is stored in the memory array is outputted sequentially to the data signal terminal SDAT through the IN/OUT controller 120, synchronized with the falling edge of the clock signal SCK (Step Sm108), where the outputted existing data DE is held until the next falling edge of the clock signal SCK. With the falling edge of the clock signal SCK, the counter value in the address counter 110 is incremented by one, and the result is that the existing data DE that is stored in the next address (data cell) of the memory array 100 is outputted to the data signal terminal SDAT. This operation is repeated, synchronized with the clock signal SCK, until the desired address is reached. That is, because the semiconductor memory device 10 according to the present example of embodiment is a sequential access-type memory device, the host computer must issue a number of clock signal pulses corresponding to the address to be read or to be written, and the counter value of the address counter 110 must be incremented until the counter value corresponding to the desired address. The result is that the existing data DE is read out sequentially from addresses specified by the counter value of the address counter 110, which is incremented sequentially synchronized with the clock signal SCK.

The host computer receives the data that is outputted sequentially from the semiconductor memory device 10 (Step Sh108). As described above, because the memory array 100 in the present example of embodiment is a sequential access memory, the data that is stored in the memory array 100 is read out sequentially until the desired address is reached. By controlling the correlation between the data to be outputted by the semiconductor storage device 10 and the number of clock pulses to be outputted to the semiconductor memory device 10, the host computer specifies, and receives, the data for the desired address (Sh110).

After the read operation has been completed, a "0" or low reset signal RST is inputted from the host computer, causing a state wherein the semiconductor memory device 10 awaits the reception of an operation code. When the reset signal RST (=0 or low) is inputted, the address counter 110, the IN/OUT controller 120, the ID comparator 130, the write/read controller 140, and the increment controller 150 are initialized.

The Write Process

Figure 5:
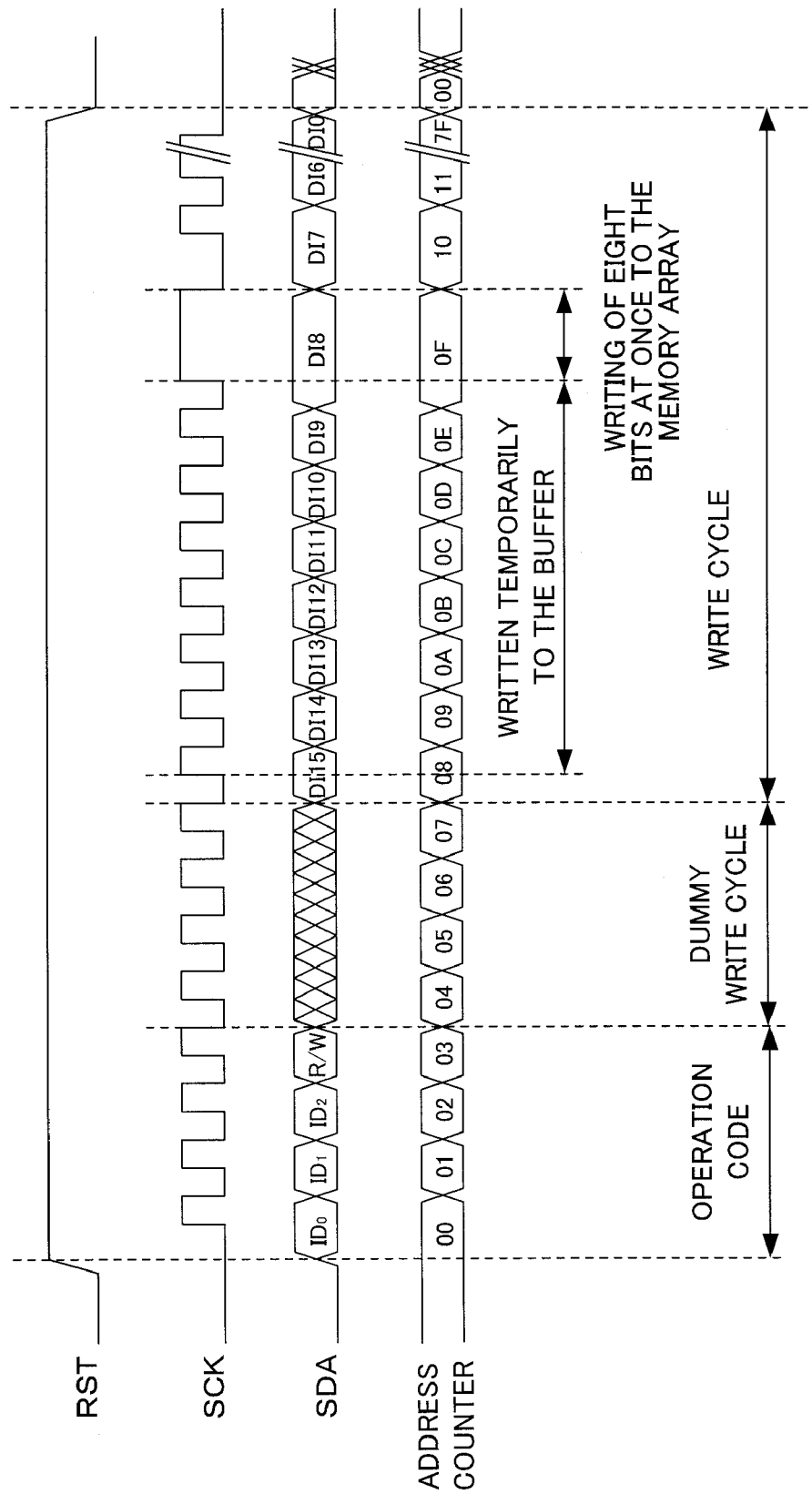
FIG. 5 is a flow chart illustrating the temporal relationships between the reset signal RST, the external clock signal SCK, the data signal SDA, and the address counter value during the execution of a write operation.
Figure 6:
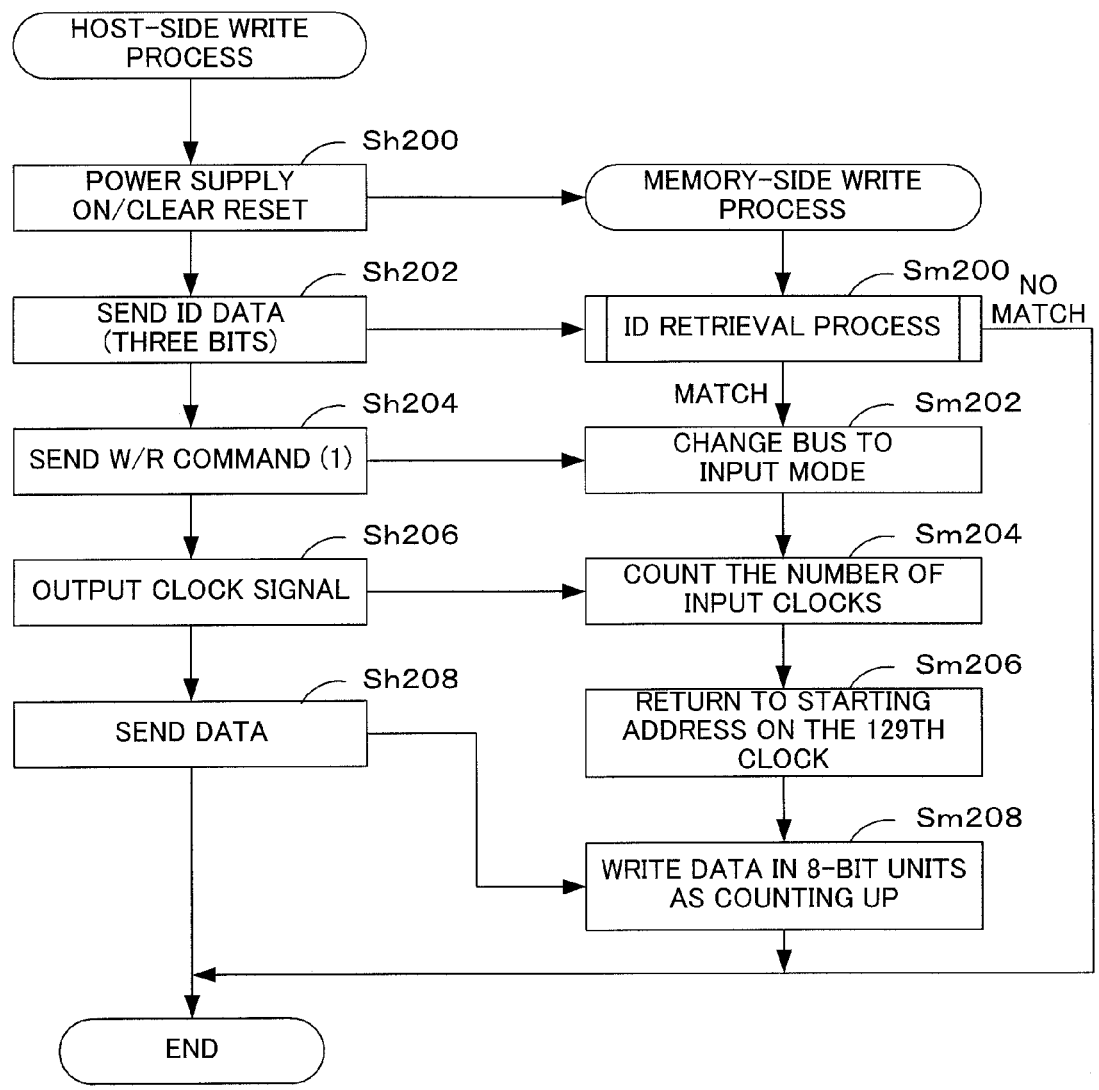
FIG. 6 is a flow chart illustrating the processing routine for a data write process that is executed by a host computer and the semiconductor memory device according to the present embodiment.

The write operation in the semiconductor memory device 10 according to the present example of embodiment will be explained in reference to FIG. 5 and FIG. 6. FIG. 5 is a timing chart illustrating the temporal relationship between the reset signal RST, the external clock signal SCK, the data signal SDA, and the address counter value at the time that a write operation is executed. FIG. 6 is a flow chart illustrating the processing routine for the data write process that is executed by the host computer and the semiconductor memory device 10 according to the present example of embodiment. In the semiconductor memory device 10 according to the present example of embodiment, the writing is performed by the row unit (the 8-bit unit), or in other words, performed by a specific address unit (an 8 address unit).

After the reset state (RST=0 or low) is cleared (RST=1 or high) by the host computer (shown in, for example, FIG. 8) (Step Sh200), the semiconductor memory device 10 launches the memory-side write process. Note that, strictly speaking, during the process of decoding the operation code it has not been determined whether the process will be a write process or a read process, for convenience in the explanation, this will be termed a "write process" in the below, including the process of decoding the operation code.

The host computer inputs, into the data signal terminal SDAT of the semiconductor memory device 10, a data signal SDA, which includes a 4-bit operation code, synchronized with the external clock signal. More specifically, the host computer first sends the 3-bit identification data to the semiconductor memory device 10 (Step Sf202).

The ID comparator 130 of the semiconductor memory device 10 performs the ID retrieval process that determines whether or not the inputted identification data matches the identification data that is stored in the memory array 100 (Sm200). Specifically, the ID comparator 130 obtains the data that is inputted into the data signal terminal SDAT, synchronized with the rising edges of the three clock signals SCK after the reset signal RST has switched from low to high, or in other words, receives the 3-bit identification data, and stores this three-bit identification data in a first three-bit register. At the same time, the ID comparator 130 obtains data from the addresses in the memory array 100 specified by the counter values 00, 01, and 02 of the address counter 110. In other words, the ID comparator 130 obtains the identification data that is stored in the memory array 100, and stores this data in a second 3-bit register.

The ID comparator 130 determines whether or not the identification data stored in the first and second registers are identical, and if the identification data are not identical (Step Sm200: No match), then the high impedance state of the input lines between the 8-bit latch register 170 and the IN/OUT controller 120 is maintained by the IN/OUT controller 120. The result is that access to the memory 100 is not enabled, and the data read process is terminated. On the other hand, if the identification data stored in the first and second registers are identical (Step Sm200: Match), then the ID comparator 130 outputs an access enable signal AEN to the write/read controller 140.

The host computer inputs, into the data signal terminal SDAT, the command bit (the write command, for example, a "1" bit), synchronized with the rising edge of the fourth clock signal SCK after the reset signal RST switched from low to high (Step Sh204). Having received the access enable signal AEN, the write/read controller 140 receives the command bit that was sent to the bus signal line through the data signal terminal SDAT, and determines whether or not this is a write command. If the command bit that has been received is a write command, and if a write enable signal WEN1 has been received from the increment controller 150, then the write/read controller 140 outputs a write enable signal WEN2 to the IN/OUT controller 120. The IN/OUT controller 120, having received the write enable signal WEN2, changes the direction of data transfer with the memory array 100 to the write direction (input mode) (Step Sm202) to enable data transfer with the memory array 100.

Furthermore, the write/read controller 140 provides notification to the address counter 110 to the effect that the requested access is for writing data. Having received this notification, the count-up unit 111 of the address counter 110 sets the maximum value to 128 bits.

The host computer outputs, to the clock signal terminal SCKT of the semiconductor memory device 10, a number of clock signal SCK pulses corresponding to the address for which access is desired, or in other words, corresponding to the address for which the data is to be read. (Step Sh206) When the number of clock pulses corresponding to the address 7FH, or in other words, "128" has been counted up by the address counter 110, the address in the memory array 100 that is pointed to by the address counter 100 and is returned to address 00H. (Step Sm206) That is, at the point wherein the value of the eighth bit (the most significant bit) in the 8-bit register in the address counter 110 goes to "1," the next access address specified will be the starting address 00H in the EEPROM 101 in the memory array 100.

After the operation code has been inputted, then, as shown in FIG. 5, 4 clock signals are inputted as dummy write clocks into the clock signal SCKT, and a write standby state is established. The host computer sends the write data to the data signal terminal SDAT of the semiconductor memory device 10. The address counter 110, synchronized with the falling edge of the clock signal SCK, and thus the counter value of the address counter 100 and will be 08 after the write standby state. Consequently, the data that is received through the data signal terminal SDAT will be written in 8-bit units beginning at address 08H in the memory array 100 in accordance with this count. (Step Sm208)

In the present example of embodiment, write data 16 bits long is written to the memory area 100, which has eight bits in a row. At the time of the write process, the first eight bits of data beginning with the most significant bits (MSB) of the write data DI are sequentially latched into the 8-bit latch register 170, synchronized with the rising edge of the clock signal SCK. Moreover, the existing data after the eighth address in the memory array 100 is outputted sequentially on the data output signal line (the data signal terminal SDAT) synchronized with the falling edge of the clock signal SCK until the write enable signal WEN2 is outputted to the IN/OUT controller 120. The existing data DE that is outputted onto the data output signal line is inputted into the increment controller 150, and is used, together with the write data DI that has been latched in the eighth-bit latch register 170, in determining whether or not the write data DI in the increment controller 150 is a value that is greater than the existing data DE. This determination process is performed after the rising edge of the clock signal SCK in the eighth cycle after the write standby state.

The IN/OUT controller 120, having received the write enable signal WEN2, changes the data transfer direction for the memory array 100 to the write direction, and releases the high impedance setting for the signal lines between the eighth-bit latch register 170 and the IN/OUT controller 120 to enable data transfer. The result is that the values of the write data DI ("0" or "1") are sent to each of the bit lines of the memory array 100. After the rising edge of the clock signal SCK in the eighth cycle after the write standby state, the write/read controller 140 requests the charge pump circuit 160 to produce the write voltage, and the write voltage that has been produced is applied to the bit lines selected by the column selector circuit 103, which, in the present example of embodiment, is all of the bit lines, with the result that the eight bits of data ("1" or "0") stored in the 8-bit latch register 170 are written all at once to the write-controlled row.

The counter value of the address counter 110 is incremented by 1 with the falling edge of the clock signal SCK in the eighth cycle, and the write data DI to be written to the next addresses (8 addresses worth) (the second byte of data) is acquired. Moreover, while the clock is low after the falling edge of the clock signal SCK in the eighth cycle, a verify process is performed to verify whether or not the existing data DE that has just been written matches the write data DI used in the writing. That is, while the clock is low, the counter value for specifying the address of the eight bits of existing data DE that have just been written is inputted into the column selector circuit 103 and the row selector circuit 104 by the four-bit counter 151 provided in the increment controller 150. The result is that the eight bits of existing data DE that have just been written are outputted from the IN/OUT controller 120, and are stored in the 8-bit internal register 153, provided in the increment controller 150, through the IN/OUT controller 120. The increment controller 150 performs a verification that the eight bits of existing data DE that have been stored in the 8-bit internal register 153 match the eight bits of write data DI that are stored in the eighth-bit latch register 170.

In the present example of embodiment, the write data DI is data that is 16 bits long, and because there are 2 write-controlled rows (8 addresses×2), when the process described above is performed twice, the writing of the write data DI to the write-controlled rows is completed. After the writing of the write data DI has been completed, then a reset signal RST (=0 or low) is inputted into the reset signal terminal RSTT by the host computer, establishing a state wherein the reception of an operation code is awaited, and completing the write procedure.

Note that the write data that is sent from the host computer, except for the data corresponding to the addresses to be changed, has the same values ("1" or "0") as the data that is already stored in the memory array 100. In other words, the address data that is not to be changed is overwritten with the same values.

When the reset signal RST (=0 or low) is inputted, the address counter 110, the IN/OUT controller 120, the ID comparator 130, the write/read controller 140, and the increment controller 150 are initialized.

Figure 7:
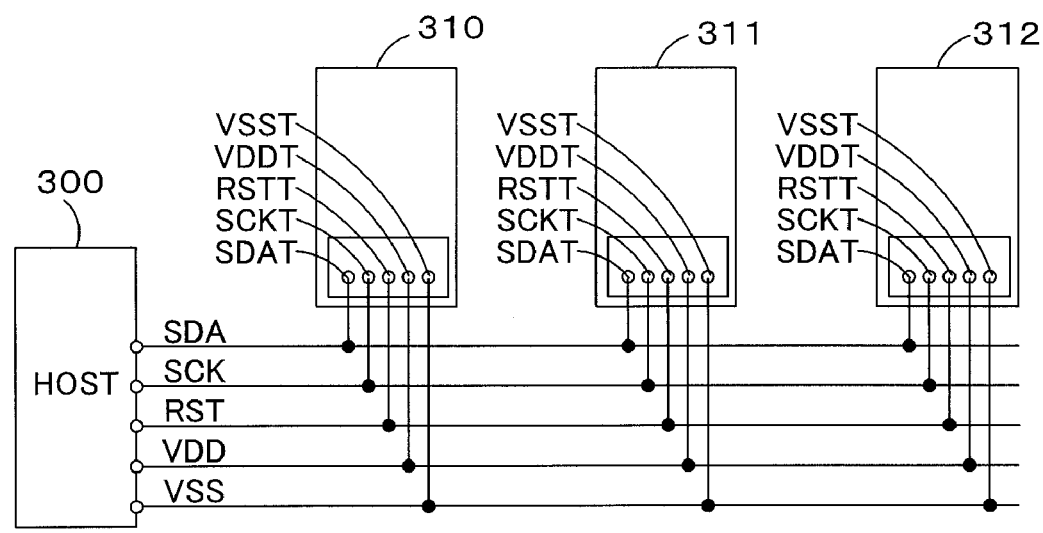
FIG. 7 shows an explanatory diagram illustrating an example of application of a semiconductor memory device according to the present embodiment.

An example of application of the semiconductor memory device and according to the present example of embodiment will be described in reference to FIG. 7. FIG. 7 is an explanatory diagram illustrating an example of application of the semiconductor memory device according to the present example of embodiment. The semiconductor memory device 10 according to the present example of embodiment is provided in a container for containing a consumable material, such as in ink containers 310, 311, and 312 for containing ink as a print recording material. When each ink container 310, 311, and 312 is installed in a printing device, each ink container 310, 311, and 312 are connected via a bus connection to a host computer 300 that is provided in the printing device. In other words, the data signal line SDA, the clock signal line SCK, the reset signal line RST, the positive power supply line VDD, and the negative power supply line Vss of the host computer 300 are connected to the semiconductor memory device 10 that is provided in each of the individual ink containers 310, 311, and 312. In the present example of application, information pertaining to the quantity of ink, that is, the remaining ink quantity or the consumed ink quantity, is stored in the semiconductor memory device 10.

As described above, given the semiconductor memory device 10 according to the present example of embodiment, the maximum counter value of the address counter 110 will be different when data is written from one data is read, and so even when a plurality of different data storage areas are provided in the semiconductor memory device 10, the scope of the circuit structure required for specifying the address can be reduced, making it possible to reduce the size of the semiconductor memory device 10. In other words, when data is written, setting the value corresponding to the maximum address to which data can be written in the EEPROM array 101 as the maximum counter value, and when data is read, setting the maximum address of the masked ROM array 102 (the number of logical addresses plus the number of virtual addresses) as the maximum counter value makes it possible to write data to the EEPROM array 101 and read data from the EEPROM array 101 and the masked ROM array 102, using a single address counter 110. Moreover, setting the maximum value of the memory capacity in the memory array 100 to $2^n$, means that only two lines are required between the address counter 110 and the memory array 100, making it possible to simplify the circuit for decoding the address. In contrast, typically the EEPROM array 101 and the masked ROM array 102 would each require the provision of a circuit structure for decoding the address, which has presented to the problem of increasing the scope of the circuitry in the semiconductor memory device. Moreover, when the maximum value of the memory capacity in the memory array is not $2^n$, then 3 or more control lines would be required between the address counter and the memory array, causing the scope of circuitry to be larger.

Moreover, because the maximum counter value when data is written is less than the maximum counter value when data is read, it is possible to achieve an increase in the processing speed in writing data in the semiconductor memory device 10. That is, when writing data requires a longer time relative to reading data, when writing data, the address specification process is not performed for the masked ROM array 102, to which data cannot be written, it is possible to achieve a reduction in the time required for writing data in the semiconductor memory device 10. On the other hand, when reading data, the address specification process is performed for the masked ROM array 102, making it possible to read the desired data from the EEPROM array 101 and the masked ROM array 102.

OTHER EMBODIMENTS (1) In order to increase the speed of processing when writing data in the semiconductor memory device 10, the processing time for writing the identification data is the most significant in the data for the EEPROM area 101. In the EEPROM area 101, temporary identification data, for example, "111," is written to the first three bits in the EEPROM area 101 prior to writing the data and the identification data. The host computer sends "111" as the operation code identification data to the semiconductor memory device 10, to start the writing of the data to the EEPROM array 101. The writing of the data proceeds through the 2nd through 16th rows of the EEPROM array 101, and is completed by writing the identification data to the first row.

In other words, when data is written to addresses starting with 08H by 8-bit units, and is completed by writing data to address 7FH (the 16th row), the address will be 7FH (where the number of clock cycles inputted is 128), so the address that is specified by the address counter 110 with the input of the next clock pulse will be 00H, the first address in the EEPROM array 101. The host computer then outputs, to the semiconductor memory device 10, the data to be written to the first row, for example, eight bits of data including the identification information pertaining to the ink color and ink type. The result is that the desired identification data is written to the first row of the EEPROM, array 101. Writing last the identification data to be stored in the first row of the EEPROM array 101 makes it possible to use the normal access logic for the semiconductor memory device 10 when performing the programming (writing the initial data) of the EEPROM array 101.

Furthermore, when verifying whether or not the programming of the EEPROM array 101 and of the masked ROM array 102 were performed correctly, the maximum counter value for the address counter 101 is set to the maximum address of the masked ROM array 102 (the number of logical addresses plus the number of virtual addresses), making it possible to read out the data up to the address BFH of the masked ROM array.

(2) While in the example of embodiment described above, an ink cartridge was used as an example of application, the present invention may provide the same effects for a toner cartridge instead. Moreover, the same effects can be obtained when applied to a medium that stores currency-equivalent information, such as a pre-paid card.

(3) The verify process in the aforementioned example of embodiment may use a 4-bit counter 151 and an internal oscillator 168, and may use the existing data DE1 latched in an 8-bit internal register 153 and the write data DI1 latched in an 8-bit latch register 170 to perform the verification process by the 8-bit unit. Conversely, without providing the 4-bit counter 151 and the 8-bit internal register 153, the first bit of write data DI1 that is eliminated bitwise from the 8-bit latch register 170 at the most significant bit, and the existing data DE1 that is read out bitwise at the MSB from a write-controlled row of the memory array 100 may be performed through bitwise comparisons. In such a case, the increment controller 150 is not needed.

(4) While, in the example of embodiment described above, multiple different data storage areas were used as an example in the explanation, it is also possible to apply the present invention to a case wherein only the EEPROM array 101 is provided. In other words, in a case wherein writing is prohibited after a specific row in the EEPROM array 101, and wherein data can be overwritten up until that specific row, setting the final address of that specific row as the maximum counter value makes it possible not only to prohibit writing to the EEPROM array 101 beyond that specific row, but also makes it possible to increase the speed of processing in overwriting up until that specific row.

(5) While write data that is 16-bits long was used as an example in explaining the present example of embodiment, it is possible instead to apply the present invention similarly to data having a data length that is a multiple of the length of one row in the memory array 100, such as 24-bits long or 32-bits long, making it possible to obtain the same effects.

While a semiconductor memory device, and an address control method in a semiconductor memory device, according to the present invention, were explained above based on several examples of embodiment, the forms of embodiment of the present invention, described above, are to facilitate understanding of the present invention, and in no wise limit the present invention. The present invention can, of course, be modified or improve, or can include equipment components, without deviating from the spirit or range of patent claims thereof. Finally, the present application claims the priority based on Japanese Patent Application No. 2005-213982 filed on Jul. 25, 2005, which is herein incorporated by reference.

What is claimed is:

1. A semiconductor memory device comprising:
an address counter that counts counter values to specify a read target address to be accessed at a time of reading data, and a write target address to be accessed at a time of writing data, wherein a maximum counter values are different at the time of reading data from at the time of writing data;
a non-volatile memory array that is accessed sequentially until the target address specified by the address counter is reached;
a data writing module that, at the time of writing data, writes data, by a specific address unit, to said write target address of said memory array; and
a data reading module that, at a time of reading data, reads out data from said read target address of said memory array.

2. A semiconductor memory device as set forth in claim 1, wherein said address counter specifies a starting address of said memory array after the counter value has counted either of said maximum counter values.

3. A semiconductor memory device as set forth in claim 2, wherein said address counter counts an external clock signal, synchronized with said external clock signal, inputted from the outside of said semiconductor memory device.

4. A semiconductor memory device as set forth in claim 1, wherein said memory array comprises a first storage area having a first final address, and a second storage area having a second final address and following said first storage area,
said maximum counter value at the time of writing data is a counter value corresponding to said first final address, and
said maximum counter value at the time of reading data is a value wherein a specific value is added to the counter value corresponding to said second final address.

5. A semiconductor memory device as set forth in claim 4, wherein said address counter specifies a starting address of said first storage area in said memory array after counting until either of said maximum counter values.

6. A semiconductor memory device as set forth in claim 5, wherein said first storage area is a storage area to which data is writable, and said second storage area is a storage area from which data is only readable.

7. A semiconductor memory device as set forth in claim 6, wherein said first storage area can store 128 bits of data;

said second storage area can store 64 bits of data, and said address counter is an 8-bit address counter, wherein, after the value of the eighth bit has become "1" at the time of writing data, the address counter specifies the starting address of said first storage area, and, at the time of reading data, after the values of all eight bits have become "1," the address counter specifies the starting address of said first storage area.

8. A print recording material container attached removably to a printing device and containing a print recording material, said print recording material container comprising:

a container unit for containing said print recording material; and a semiconductor memory device as set forth in any of claims 1 through 7.

9. A printing system comprising the printing device and the print recording material container as set forth in claim 8, attached removably to said printing device, wherein:

said printing device is provided with a host computer that is bus-connected to said semiconductor memory device that is equipped in said print recording material container through a data signal line, a clock signal line, a reset signal line, a positive power supply line, and a negative power supply line, and that sends, to said semiconductor memory device, quantity data relating to the print recording material consumed in the printing device; and wherein said semiconductor memory device that is installed in said print recording material container stores, in a memory array, quantity data received relating to said print recording material.

10. An address control method in a semiconductor memory device provided with a non-volatile memory including a memory array that is accessed sequentially by an address counter that counts counter values that are synchronized with an external clock until a specified target address is reached, said method comprising:

determining whether an access request to said memory array is a write request or a read request;

specifying a starting address of said memory array when said access request is a write request and said external clock has been counted until a first maximum counter value; and specifying a first address in said memory array when said access request is a read request and said external clock has been counted until a second maximum counter value that is larger than said first maximum counter value.

* * * * *

UNITED STATES PATENT AND TRADEMARK OFFICE
CERTIFICATE OF CORRECTION

PATENT NO. : 7,591,524 B2  Page 1 of 1
APPLICATION NO. : 11/458820
DATED : September 22, 2009
INVENTOR(S) : Noboru Asauchi It is certified that error appears in the above-identified patent and that said Letters Patent is hereby corrected as shown below:

Cover Page:
　　Please add the following:

--(30)　　Foreign Application Priority Data
　　Jul. 25, 2005 (JP) ....................... 2005-213982--.

Signed and Sealed this

Twenty-ninth Day of June, 2010

David J. Kappos
*Director of the United States Patent and Trademark Office*